United States Patent
Hurley et al.

(10) Patent No.: US 8,402,399 B2
(45) Date of Patent: Mar. 19, 2013

(54) METHOD AND SYSTEM FOR COMPUTING FOURIER SERIES COEFFICIENTS FOR MASK LAYOUTS USING FFT

(75) Inventors: Paul T Hurley, Zurich (CH); Krzysztof Kryszczuk, Adliswil (CH); Robin Scheibler, Zurich (CH); Davide Schipani, Zurih (CH)

(73) Assignee: International Business Machines Corporation, Armonk, NY (US)

( * ) Notice: Subject to any disclaimer, the term of this patent is extended or adjusted under 35 U.S.C. 154(b) by 90 days.

(21) Appl. No.: 13/082,440

(22) Filed: Apr. 8, 2011

(65) Prior Publication Data

US 2011/0271240 A1   Nov. 3, 2011

(30) Foreign Application Priority Data

Apr. 30, 2010 (EP) .................. 10161674

(51) Int. Cl.
 *G06F 17/50*  (2006.01)
(52) U.S. Cl. ............... 716/55; 716/50; 716/54
(58) Field of Classification Search ............ 716/50, 716/54, 55
See application file for complete search history.

(56) References Cited

U.S. PATENT DOCUMENTS

| | | | |
|---|---|---|---|
| 6,098,088 A * | 8/2000 | He et al. ............ | 708/406 |
| 7,003,758 B2 | 2/2006 | Ye et al. | |
| 7,472,372 B1 * | 12/2008 | Fiekowsky et al. ........ | 716/53 |
| 7,568,174 B2 | 7/2009 | Sezinger et al. | |
| 7,856,612 B1 * | 12/2010 | Ungar et al. ............. | 716/55 |
| 2005/0185159 A1 | 8/2005 | Rosenbluth et al. | |
| 2009/0083692 A1 | 3/2009 | Rieger et al. | |
| 2009/0180711 A1 | 7/2009 | Lavin et al. | |
| 2010/0191792 A1 * | 7/2010 | Brown et al. ............ | 708/404 |
| 2011/0047519 A1 * | 2/2011 | Torres Robles et al. ....... | 716/52 |

OTHER PUBLICATIONS

E. Cator et al., "A Sampling Problem From Lithography for Chip Layout," Proceedings of the fifty-eighth European study group with industry, 2007, http://www.math.leidenuniv.nl/~dworm/asml.pdf.
P. Yu et al., "TIP-OPC: A New Topological Invariant Paradigm for Pixel Based Optical Proximity Correction" Computer-Aided Design, 2007. ICCAD 2007. IEEE/ACM International Conference, I Nov. 4-8, 2007, 847-53.
Granik, "Fast Pixel-Based Mask Optimization for Inverse Lithography," Microfab., Microsyst. 5, 043002 (Dec. 13, 2006); doi:10.1117/1.2399537.

* cited by examiner

*Primary Examiner* — Thuan Do
*Assistant Examiner* — Magid Dimyan
(74) *Attorney, Agent, or Firm* — Vazken Alexanian

(57) ABSTRACT

A method and system for computing Fourier coefficients for a Fourier representation of a mask transmission function for a lithography mask. The method includes: sampling a polygon of a mask pattern of the lithography mask to obtain an indicator function which defines the polygon, performing a Fourier Transform on the indicator function to obtain preliminary Fourier coefficients, and scaling the Fourier coefficients for the Fourier representation of the mask transmission function, where at least one of the steps is carried out using a computer device.

13 Claims, 3 Drawing Sheets

METHOD AND SYSTEM FOR COMPUTING FOURIER SERIES COEFFICIENTS FOR MASK LAYOUTS USING FFT

CROSS-REFERENCE TO RELATED APPLICATION

This application claims priority under 35 U.S.C. §119 from European Patent Application No. 10161674.6 filed Apr. 30, 2010, the entire contents of which are incorporated herein by reference.

BACKGROUND OF INVENTION

1. Field of the Invention

The present invention relates to a method for computing Fourier series coefficients for mask layouts used in modern optical lithography processes.

2. Description of the Related Art

U.S. Pat. No. 7,568,174 B2 describes a "Method for Checking the Printability of a Lithography Target."

U.S. Pat. No. 7,000,3758 B2 describes a "A System and Method For Lithography Simulation."

U.S. Patent Pub. No. 20090083692 A1 describes a "Flash-Based Anti-Aliasing Techniques for High-Accuracy High Efficiency Mask Synthesis."

U.S. Patent Pub. No. 20050185159 A1 describes "A Fast Model-Based Optical Proximity Correction."

There is a need to calculate the Fourier coefficients for 2D mask design in a manner that is less time-consuming and avoids the introduction of aliasing.

SUMMARY OF THE INVENTION

It is an object of the present invention to provide a method for calculating a Fourier representation of mask transmission function of IC mask layouts in a more efficient manner, in addition to reducing aliasing.

One aspect of the invention includes a method for computing Fourier coefficients for a Fourier representation of a mask transmission function for the print simulation of a lithography mask used in the manufacture of lithography masks, the lithography masks having use in the manufacture of integrated circuits, the method including the steps of: sampling at least one polygon of a mask pattern of the lithography mask to obtain an indicator function defining at least one polygon, performing a Fourier Transform on the indicator function to obtain Preliminary Fourier coefficients, and scaling the Preliminary Fourier coefficients to obtain the Fourier coefficients of the Fourier representation of the mask transmission function, where at least one of the steps is carried out using a computer device.

Another aspect of the invention includes a method for computing Fourier coefficients for a Fourier representation of a mask transmission function for the print simulation of a lithography mask used in the manufacture of lithography masks, the lithography masks having use in the manufacture of integrated circuits. The method includes the steps of: sampling at least one polygon of a mask pattern of the lithography mask to obtain an indicator function defining at least one polygon, performing a Fourier Transform on the indicator function to obtain Preliminary Fourier coefficients, scaling the Preliminary Fourier coefficients to obtain the Fourier coefficients of the Fourier representation of the mask transmission function, using the Fourier coefficients to obtain a print simulation of the lithography mask, and using the print simulation in the manufacture of at least one of lithography mask and integrated circuit, where at least one of the steps is carried out using a computer device.

Another aspect of the invention includes a system for computing Fourier coefficients for a Fourier representation of a mask transmission function for a lithography mask. The system includes a means for sampling at least one polygon of a mask pattern of the lithography mask to obtain an indicator function defining at least one polygon; a computer device including means for performing a Fourier Transform operation on the indicator function to obtain preliminary Fourier coefficients; and scaling means for scaling the preliminary Fourier coefficients to obtain the Fourier coefficients for the Fourier representation of the mask transmission function.

BRIEF DESCRIPTION OF THE DRAWINGS

Embodiments of the present invention are described in detail in conjunction with the accompanying drawings, in which.

DETAILED DESCRIPTION OF THE PREFERRED EMBODIMENTS

In optical lithography, the Fourier representation of mask layers is commonly used for mask optimization procedures such as model-based optical proximity correction (OPC) or source-mask optimization (SMO). The Fourier representation of mask layers is based on Fourier coefficients. To efficiently and accurately compute the Fourier series coefficients of patterns, such as polygons for IC mask designs,—is essential for the print simulation in the mask manufacturing process.

The print simulation is vital due to the very high cost of mask manufacturing. The print simulation takes into account the Fourier Transformation of the optical system as well as the Fourier Transformation of the mask transmission function. Combining these and performing an inverse Fourier Transformation lead to the illuminated pattern on a resist and in conjunction with a resist model and an etching model the printed image using the IC mask can be simulated. Hence, it is understood that the accuracy of the Fourier coefficients used to describe the mask transmission function is essential.

A potential embodiment of the above method is to obtain exact Fourier coefficients from the preliminary Fourier coefficients of a discrete Fourier Transformation of an indicator function derived from one or more polygons of a mask layout. The indicator function describes the one or more polygons by a minimum of pixels. Every polygon in the mask pattern is hence represented by a sample having a reduced number of pixels such that the complexity of the Fourier Transform based on that indicator function is essentially reduced. The Fourier coefficients can be obtained by a scaling relationship by multiplying preliminary Fourier coefficients obtained by the Fourier Transform with a provided scaling factor to obtain the exact Fourier coefficients.

Furthermore, tiles may be defined as a portion of the mask layout with one or more polygons such that the one or more polygons are fully contained in the tile, wherein the pixel size may be defined as a pixel size in at least one dimension wherein the pixel size in the at least one dimension is obtained as the greatest common divider of the tile size in the at least one dimension and the coordinates of the vertices of the one or more polygons in the at least one dimension.

The indicator function can represent the polygon by a function of coordinates within the tile, wherein the function defines whether a point is within the polygon or not over the coordinates, each coordinate corresponds to a pixel having the pixel size in the at least one dimension.

Figure 1:
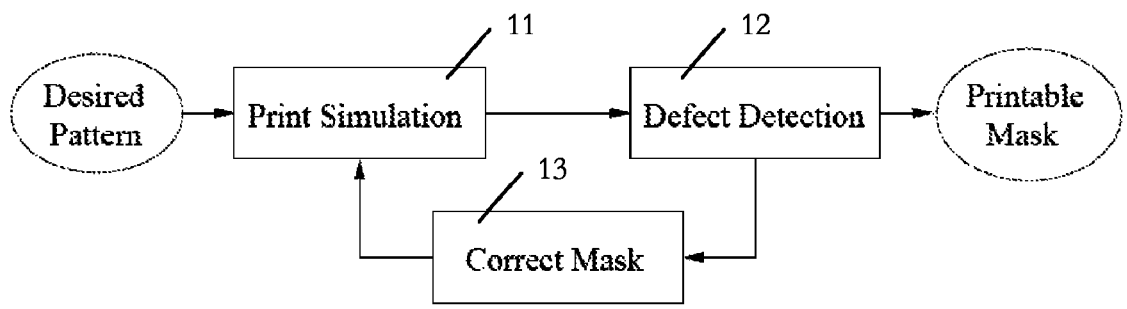
FIG. 1 shows the overall process of designing a pattern of a printable mask which results in a desired pattern when used in an optical lithography system.

FIG. 1 shows schematically the general steps for designing a lithography mask used e.g. for a manufacturing process of highly integrated circuits having a pattern size in a range of the wavelength of the illuminating light of the lithography equipment. Starting with a given desired pattern which shall be obtained on a substrate, a print simulation 11 of an initial mask layout is performed by simulating the behavior of illuminating light being passed through the initial mask layout and its effect on a photoresist to be exposed. The result is a simulated printed image which can be compared with the given desired pattern in a defect detection process 12. Depending on the differences between the desired pattern and the simulated printed image, the initial mask layout is iteratively modified in a correction process 13 and the step of simulating the printed image is repeated as long as a measure of the difference between the simulated printed image and the desired pattern is above a tolerance threshold.

Figure 2:
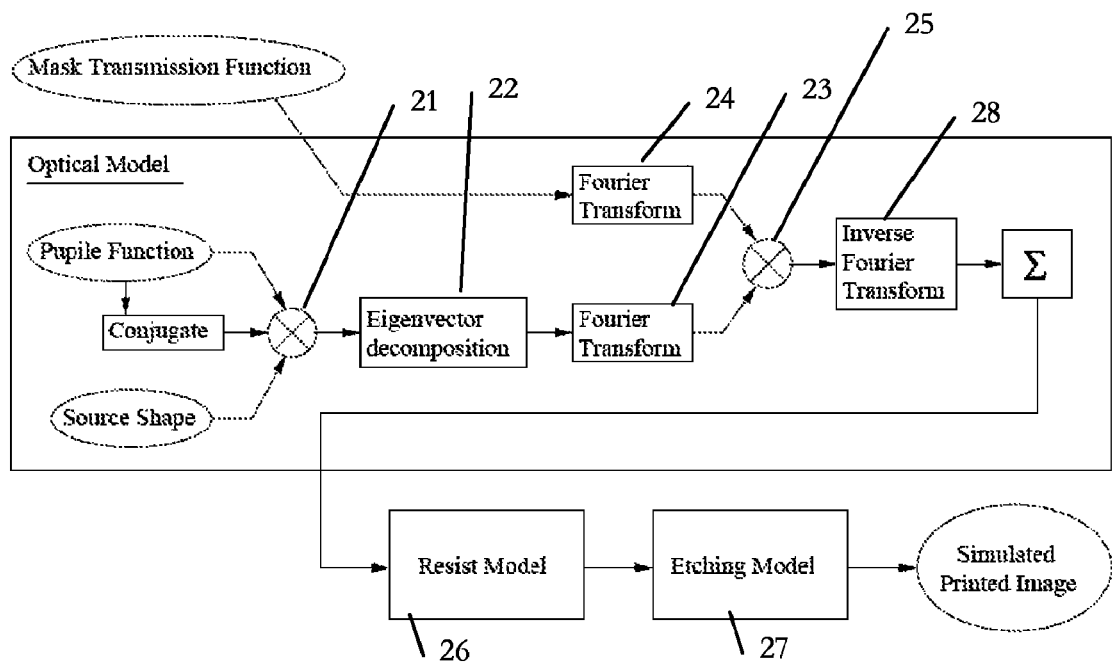
FIG. 2 shows a schematic diagram for illustrating details of the print simulation process of a given mask layout.

In FIG. 2, the print simulation process of a given lithography mask layout is shown in more detail. As an overview, the simulated printed image is obtained by taking into account the optical model of the lithography environment as well as the resist model and the etching model modeling the behavior of the photoresist applied onto the substrate and the characteristics of an etchant used for etching the exposed (or non-exposed) photoresist, respectively. The optical modeling of the lithography environment is done using a pupil function describing the transmission of the one or more lenses and the characteristics of the source which are mixed in a mixing process 21 and fed to an Eigenvector decomposition process 22. The result of the Eigenvector decomposition process 22 is Fourier-Transformed in a first Fourier Transform process 23 to obtain a Fourier representation of optical model.

In a second Fourier Transform process 24 the mask transmission function of the lithography mask layout is also Fourier-Transformed such that the Fourier representation of the lithography mask layout and the Fourier representation of the optical model of the lithography environment are mixed in a second mixing process 25 and supplied to an inverse Fourier Transform process 28 to obtain a simulated illumination pattern of light which is irradiated onto the substrate. By feeding the simulated illumination pattern to a subsequent resist model process 26 for taking into account the characteristics of the photoresist and etching model process 27 for taking into account the characteristics of the etching process the simulated printed image can be obtained.

As mentioned before, the Fourier Transformation of the mask transmission function of the lithography mask layout can be complex, so that for modern IC layouts the complexity is not tractable anymore. Using a discrete Fourier Transform on a sampled lithography mask layout the complexity can be reduced. However, aliasing is introduced such that the Fourier coefficients computed do not correspond anymore to the original mask pattern.

Figure 4:
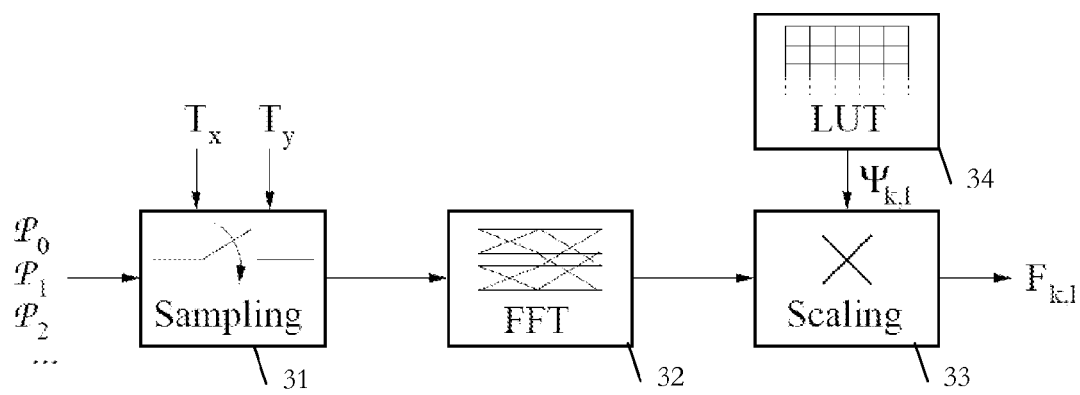
FIG. 4 shows a block diagram for illustrating the method steps of computing the exact Fourier coefficient of a mask transmission function.

According to one embodiment proposed herein, the Fourier Transform of the given desired lithography mask layout is computed in three steps. These steps are illustrated in the block diagram of FIG. 4.

According to a first step, which is a sampling step 31, the given lithography mask layout is sampled.

It is common to apply the transformation over a rectangular subset $T \epsilon R^2$, which is called a tile:

$$T = [0, T_x) \times [0, T_y), \, T_x, T_y \epsilon N$$

wherein $T_x$ and $T_y$ correspond to the size of the tile in two dimensions (x-axis, y-axis) in Cartesian coordinates. In the context of a semiconductor manufacturing process, this section can consist of the entire substrate layer or a subsection thereof. In many cases, the layer will be divided up into individual tiles and the polygons in each tile are obtained by extracting the tiles such that only the polygon description is kept that fits into the particular tile.

A rectilinear polygon P contained in the tile is a subset of the tile whose boundaries are parallel either to the x-axis or the y-axis. The polygon P can be described by the ordered list of its K vertices:

$$\{(x_0, y_0), (x_1, y_1), \ldots, (x_{K-1}, y_{K-1})\}, (x_i, y_i) \epsilon Z^2$$

Figure 3:
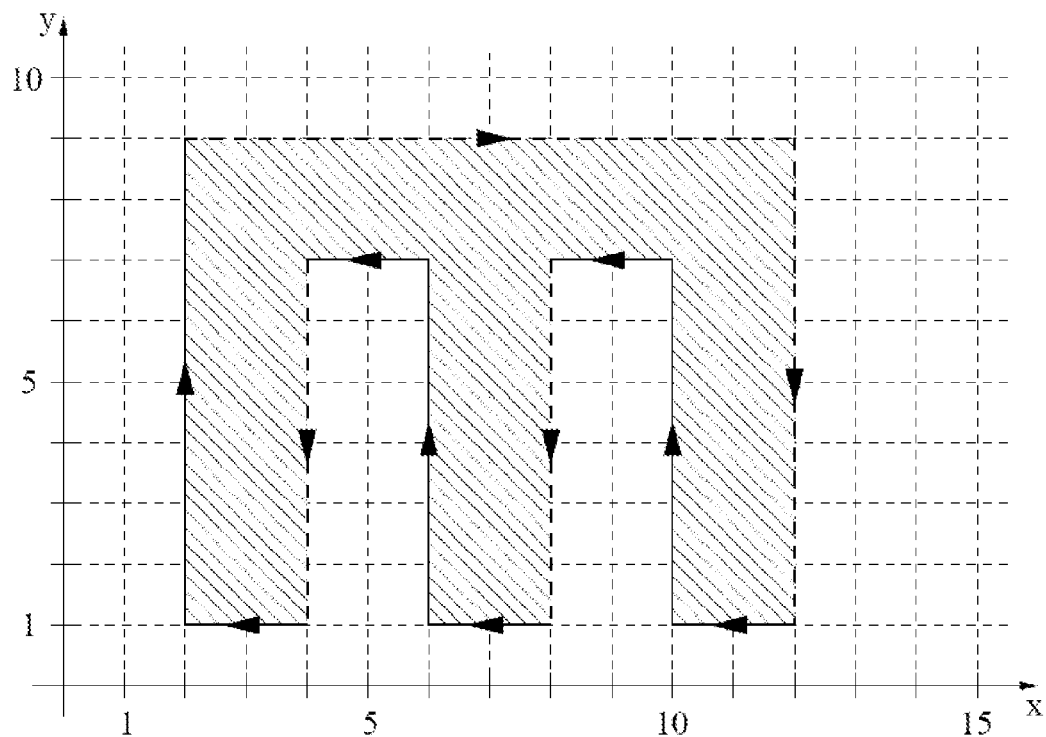
FIG. 3 shows an example of a tile consisting of a rectilinear polygon.

The vertices of the polygon P can be ordered clockwise in this embodiment, as illustrated by an example polygon which is shown in FIG. 3. Usually, as in a semiconductor manufacturing process the polygons contained in a tile are non-overlapping and thus the mask transmission function can be defined as the sum of the indicator functions f(x, y) of the different polygons $P_0, \ldots, P_{M-1} \subseteq T$:

$$f_T(x, y) = \sum_{i=0}^{M-1} 1_{\{(x,y) \in P_i\}}$$

The indicator function f(x, y) corresponds to a function of coordinates within the tile, wherein the function defines whether a point is within the polygon or not over the coordinates.

The sampling of the discrete image is done essentially by sampling f(x, y) on a regular grid. The grid is chosen in order to minimize the size of the discrete image created and such that every polygon P can be represented as an integer number of pixels. Thus, a pixel is of the size $p_x \times p_y$, where $p_x$ is the greatest common divider (GCD) of $T_x$ and the x-coordinates of the polygons' vertices and respectively $p_y$ is the GCD of $T_y$ and the y-coordinates of the polygons' vertices. In other words, $p_x$ and $p_y$ represent the greatest common dividers of all the distances (from the origin) along the x-coordinates and the y-coordinates, respectively, between the vertices defining the polygon P as indicated in (2). Then, the discrete image is given by:

$$\hat{f}_T[m, n] = f_T(p_x m, p_y n) \quad \begin{matrix} m = 0, \ldots, N_x - 1 \\ n = 0, \ldots, N_y - 1 \end{matrix}$$

$$\text{where } N_x = \frac{T_x}{p_x} \text{ and } N_y = \frac{T_y}{p_y}$$

The inputs are the coordinates of the vertices of the polygons, the tile size is $T_x \times T_y$ and the pixel size is $p_x \times p_y$.

The sampling step can be implemented in hardware using a simple logic or in software.

In the second step, which is a Fourier-Transform process 32, the two-dimensional fast Fourier Transformation of $f_T[m, n]$ is computed. For example, the computation can be implemented using a standard butterfly hardware structure. The preliminary Fourier coefficients are obtained as follows:

$$\hat{F}_{k,l} = FFT_{k,l}\{\hat{f}_T[m,n]\} \begin{array}{l} k = 0, \ldots, N_x - 1 \\ l = 0, \ldots, N_y - 1 \end{array}$$

In a next step, which is a scaling process 33, a scaling procedure is performed on the obtained preliminary Fourier series coefficients $\hat{F}_{k,l}$ of $f(x, y)$ by using the following relationship:

$$F_{k,l} = \Psi_{k,l} \hat{F}_{k,l}$$

wherein the scaling factor is given by:

$$\Psi_{k,l} = p_x p_y \operatorname{sinc}\left(\frac{k}{N_x}\right) \operatorname{sinc}\left(\frac{l}{N_y}\right) e^{-j\pi\left(\frac{k}{N_x} + \frac{l}{N_y}\right)}$$

The sin c function is defined as:

$$\sin c(x) = \frac{\sin(\pi x)}{\pi x}$$

By convention, sin c (0)=1. This scaling factor can be written as:

$$\Psi_{k,l} = \beta e^{-j\theta}$$

$$\beta = p_x p_y \sin c\left(\frac{k}{N_x}\right) \sin c\left(\frac{l}{N_y}\right)$$

$$\theta = \pi\left(\frac{k}{N_x} + \frac{l}{N_y}\right)$$

Thus in practice, the multiplication of a complex number z by $\Psi_{k,l}$ can be implemented using three additions and three multiplications as described in H. J. Nussbaumer, "Fast Fourier Transform and Convolution Algorithms", Springer Verlag, Berlin, 1982, an implementation of which is schematically shown in FIG. 5.

Figure 5:
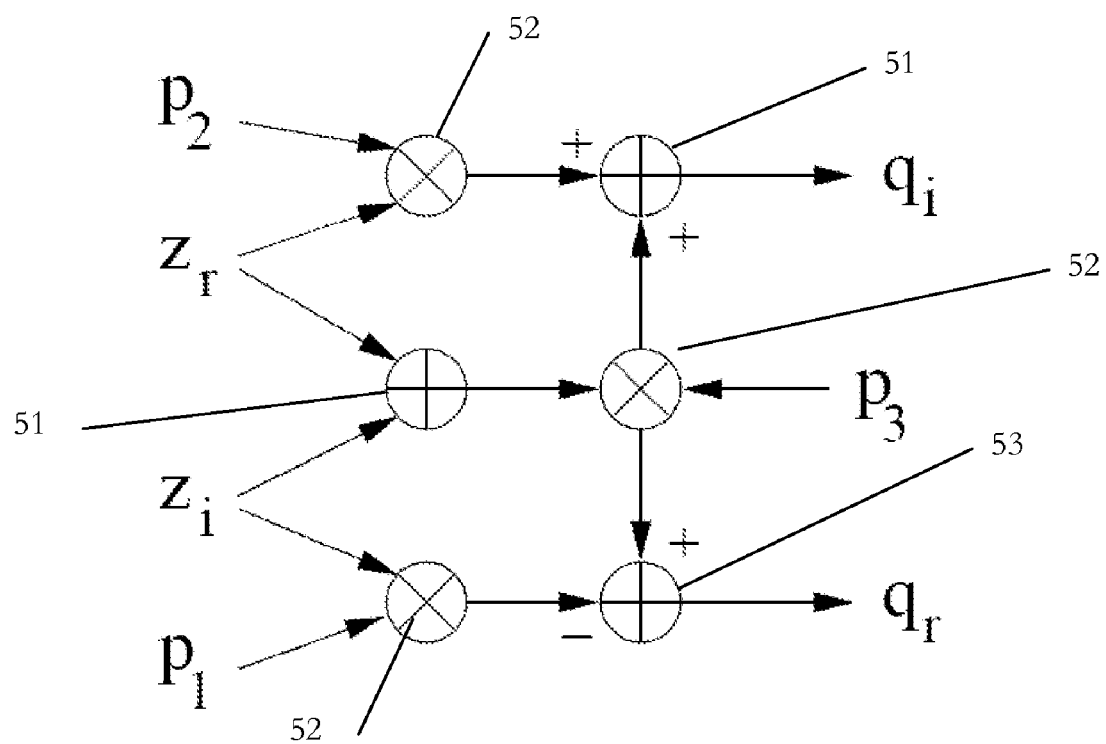
FIG. 5 shows a schematic representation of an implementation of the scaling step.

$p_1 = \beta(\cos\theta - \sin\theta)$ $p_2 = -\beta(\cos\theta + \sin\theta)$ $p_3 = \beta \cos\theta$ $s_1 = Re\{z\} + Im\{z\}$ $m_1 = s_1 p_3$ $m_2 = p_1 Im\{z\}$ $m_3 = p_2 Re\{z\}$ $Re\{\beta e^{-j\theta} z\} = m_1 - m_2$ $Im\{\beta e^{-j\theta} z\} = m_1 + m_3$ FIG. 5 shows a possible implementation of the scaling step which is made of adder stages 51, multiplication stages 52 and a subtraction stage 53. The indices r and i denote respectively real and imaginary parts. The output corresponds to $q = \beta e^{-j\theta} z$ The scaling factors $p_1$, $p_2$ and $p_3$ can be precomputed and stored in a lookup table 34. In hardware this can be implemented using simple logic. Alternatively, a CORDIC unit can be used performing a multiplication by a scalar and vector rotation in a single step or only vector rotation using two multiplicators in addition for the multiplication by $\beta$. In that case, only $\beta$ and $\theta$ need to be stored in the lookup table 34. As an alternative implementation, the calculation can be performed in a microprocessor carrying out a software code.

In the following, the mathematical background is discussed to show that the Fourier series of $f(x, y)$ can be expressed in terms of the discrete Fourier Transform of $$\hat{f}[m, n]$$

$$F_{k,l} = \Psi_{k,l} \hat{F}_{k,l}$$

where $$F_{k,l} = F_{k,l}\{f\}$$

$$\hat{F}_{k,l} = DFT\{\hat{f}\} = \sum_{m=0}^{N_x-1} \sum_{n=0}^{N_y-1} \hat{f}[m,n] e^{-j2\pi\left(\frac{km}{N_x} + \frac{ln}{N_y}\right)}$$

When $f(x, y)$ is the indicator function of M non-overlapping rectilinear polygons included in a tile $T=[0, T_x) \times [0, T_y)$, as described above, the coordinates of the polygons are:

$$\bigcup_{i=0}^{M-1} \{(x_{i,j}, y_{i,j})\}_{j=0}^{K_i-1}, x_{i,j} \in \{0, \ldots, T_x\}, y_{i,j} \in \{0, \ldots, T_y\}$$

where $K_i$ is the number of vertices of the $i^{th}$ polygon. Choose $p_x$, $p_y \in N$ such that $x_{i,j} = p_x \tilde{x}_{i,j}$, $\tilde{x}_{i,j} \in N$, $\forall i,j$ $T_x = p_x N_x$, $N_x \in N$ $y_{i,j} = p_y \tilde{y}_{i,j}$, $\tilde{y}_{i,j} \in N$, $\forall i,j$ $T_y = p_y N_y$, $N_y \in N$ Since $p_x = 1$ and $p_y = 1$ always satisfy these relationships such numbers can be found easily. However, $p_x$ and $p_y$ should be chosen as large as possible, hence:

$$p_x = GCD\left(T_x, \bigcup_{i=0}^{M-1} \{x_{i,j}\}_{j=0}^{K_i-1}\right)$$

$$p_y = GCD\left(T_y, \bigcup_{i=0}^{M-1} \{y_{i,j}\}_{j=0}^{K_i-1}\right)$$

where $GCD(a, b, \ldots)$ gives the greatest common divider of all the numbers in argument. Pixel function is as follows:

$$\psi(x, y) = \begin{cases} 1 & \text{if } 0 \le x < p_x \text{ and } 0 \le y < p_y \\ 0 & \text{otherwise} \end{cases}$$

Finally, it is possible to define the sampled version of $f(x, y)$ as outlined before:

$\hat{f}[m,n] = f(mp_x, np_y)$, $m = 0, \ldots, N_x - 1$ $n = 0, \ldots, N_y - 1$ If the relations of above equations are respected, then we have the following relationship between f(x, y) and f̂[m, n]:

$$f(x, y) = \sum_{m=0}^{N_x-1} \sum_{n=0}^{N_y-1} \hat{f}[m, n]\psi(x + mp_x, y - np_y)$$

To compute the Fourier series coefficients of this expression, f and Ψ has to be made periodic of period $T_x$ and $T_y$ in the x and y direction, respectively. Thus, the 2D Fourier series coefficients can be computed as:

$$F\{f\} = \int_0^{T_x} \int_0^{T_y} f(x, y)e^{-j(w_x kx + w_y ly)} dx dy$$

where $w_x = \frac{2\pi}{T_x}$ and $w_y = \frac{2\pi}{T_y}$

Combining both equations above:

$$F\{f\} = \int_0^{T_x} \int_0^{T_y} \sum_{m=0}^{N_x-1} \sum_{n=0}^{N_y-1} \hat{f}[m, n]\psi(x - mp_x, y - np_y)e^{-j(x_x kx + w_y ly)} dx dy$$

Furthermore:

$$e^{-j(w_x kx + w_y ly)} = e^{-j(w_x k(x - mp_x) + w_y l(y - np_y))} e^{-j(w_x kmp_x + w_y lnp_y)}$$

$$= e^{-j(x_x ky + w_y lv)} e^{-j2\pi\left(\frac{km}{N_x} + \frac{ln}{N_y}\right)}$$

where we used the substitution $u = x - mp_x$ and $v = y - np_y$. Hence it becomes:

$$F\{f\} = \sum_{m=0}^{N_x-1} \sum_{n=0}^{N_y-1} \hat{f}[m, n]e^{-j2\pi\left(\frac{km}{N_x} + \frac{ln}{N_y}\right)}$$

$$\int_{-mp_x}^{T_x - mp_x} \int_{-np_y}^{T_y - np_y} \psi(u, v)e^{-j(w_x ku + w_y lv)} du dv$$

$$\stackrel{a}{=} \sum_{m=0}^{N_x-1} \sum_{n=0}^{N_y-1} \hat{f}[m, n]e^{-j2\pi\left(\frac{km}{N_x} + \frac{ln}{N_y}\right)}$$

$$\int_0^{T_x} \int_0^{T_y} \psi(u, v)e^{-j(w_x ku + w_y lv)} du dv$$

$$= DFT\{\hat{f}\}F\{\psi\}$$

where we used in (a) the periodicity of Ψ(x, y) to remove the dependency of the integral on m and n.

Now the value of $\Psi_{k,l} = F_{k,l}\{\Psi\}$ is computed. Ψ(x, y) can be written as:

$$\psi(x, y) = rect_{p_x}\left(x - \frac{p_x}{2}\right) rect_{p_y}\left(y - \frac{p_y}{2}\right)$$

where $$rect_B(t) = \begin{cases} 1 & \text{if } -\frac{B}{2} \leq t < \frac{B}{2} \\ 0 & \text{otherwise} \end{cases}$$

and if it is periodized with period T, the corresponding Fourier series is given by:

$$F_k\{rect_B\} = B \sin c\left(\frac{k}{T}B\right) = \frac{\sin\left(\pi\frac{k}{T}B\right)}{\pi\frac{k}{T}}$$

If in addition the delay property and the separability of the Fourier series is used:

$$\psi_{k,l} = p_x \text{sinc}\left(\frac{k}{T_x}p_x\right) e^{-j2\pi\frac{k}{T_x}\frac{p_x}{2}} p_y \text{sinc}\left(\frac{l}{T_y}p_y\right) e^{-j2\pi\frac{l}{T_y}\frac{p_y}{2}}$$

$$p_x \text{sinc}\left(\frac{k}{N_x}\right) e^{-j\pi\frac{k}{N_x}} p_y \text{sinc}\left(\frac{l}{N_y}\right) e^{-j\pi\frac{1}{N_y}}$$

In conclusion we can show that the Fourier series of f(x, y) can be expressed in terms of the DFT of f̂[m, n]:

where $F_{k,l} = \Psi_{k,l} \hat{F}_{k,l}$ $F_{k,l} = F_{k,l}\{f\}$ $$\hat{F}_{k,l} = DFT\{\hat{f}\} = \sum_{m=0}^{N_x-1} \sum_{n=0}^{N_y-1} \hat{f}[m, n]e^{-2\pi\left(\frac{km}{N_x} + \frac{ln}{N_y}\right)}$$

While the present invention has been described with reference to certain embodiments, it will be understood by those skilled in the art that various changes can be made and equivalents can be substituted without departing from the scope of the present invention. In addition, many modifications can be made to adapt a particular situation to the teachings of the present invention without departing from its scope. Therefore, it is intended that the present invention not be limited to the particular embodiment disclosed, but that the present invention will include all embodiments falling within the scope of the appended claims. For example, the present invention can be contemplated for various applications. While embodiments described above shall merely find applications in lithography masks, the skilled person can appreciate potential applications to other methods of printing. Furthermore, alternative definitions can be used for the Fourier coefficients, the Fourier Transform, etc., as usual in this field. Also, various Fourier Transform types can be relied upon, e.g. a Fast Fourier Transform or evolutions thereof.

We claim:

1. A Method for computing Fourier coefficients for a Fourier representation of a mask transmission function for the print simulation of a lithography mask used in the manufacture of lithography masks, said lithography masks having use in the manufacture of integrated circuits, the method comprising the steps of:
   sampling at least one polygon of a mask pattern of the lithography mask to obtain an indicator function defining said at least one polygon using a number of pixels;
   performing a Fourier Transform on said indicator function to obtain preliminary Fourier coefficients; and
   scaling said preliminary Fourier coefficients to obtain the Fourier coefficients for the Fourier representation of said mask transmission function,
   wherein said mask pattern comprises at least one tile, which in turn comprises said at least one polygon such that said at least one polygon is fully contained therein,
   wherein pixel size of said number of pixels is defined in at least one dimension,
   wherein said pixel size in said at least one dimension is obtained as i) a greatest common divider of tile size of said at least one tile in said at least one dimension and ii) coordinates of vertices of said at least one polygon in said at least one dimension,
   wherein at least one of the steps is carried out using a computer device.

2. The Method according to claim 1, wherein said Fourier Transform is a Fast Fourier Transform.

3. The Method according to claim 1, wherein said Fourier Transform is a Discrete Fourier Transform.

4. The Method according to claim 1, wherein the sampling step utilizes the minimal number of pixels possible.

5. The Method according to claim 1, further comprising the step of using the obtained Fourier coefficients to obtain a print simulation of said lithography mask.

6. The Method according to claim 1, further comprising the step of using the obtained Fourier coefficients for manufacture of at least one of integrated circuits and lithography masks.

7. The Method according to claim 1, wherein said indicator function represents said at least one polygon by a function of coordinates within the tile, wherein said indicator function defines whether a point is within said at least one polygon, wherein each said coordinate corresponds to a pixel having the pixel size in the at least one dimension.

8. The Method according to claim 7, wherein the step of scaling the preliminary Fourier coefficients is performed by multiplying said preliminary Fourier coefficients by scaling factors to obtain said Fourier coefficients for said Fourier representation of said mask transmission function, wherein said scaling factors are determined according to a scaling factor function depending on the coordinates.

9. The Method according to claim 8, wherein said scaling factors are provided using a lookup table.

10. A System for computing Fourier coefficients for a Fourier representation of a mask transmission function for a lithography mask, comprising:
    means for sampling at least one polygon of a mask pattern of the lithography mask to obtain an indicator function defining said at least one polygon using a number of pixels;
    a computer device including means for performing a Fourier Transform operation on said indicator function to obtain preliminary Fourier coefficients; and
    scaling means for scaling said preliminary Fourier coefficients to obtain the Fourier coefficients for the Fourier representation of the mask transmission function,
    wherein said mask pattern comprises at least one tile, which in turn comprises said at least one polygon such that said at least one polygon is fully contained therein,
    wherein pixel size of said number of pixels is defined in at least one dimension,
    wherein said pixel size in said at least one dimension is obtained as i) a greatest common divider of tile size of said at least one tile in said at least one dimension and ii) coordinates of vertices of said at least one polygon in said at least one dimension.

11. A Method for computing Fourier coefficients for a Fourier representation of a mask transmission function for the print simulation of a lithography mask used in the manufacture of lithography masks, said lithography masks having use in the manufacture of integrated circuits, the method comprising the steps of:
    sampling at least one polygon of a mask pattern of the lithography mask to obtain an indicator function defining said one or more polygons using a number of pixels;
    performing a Fourier Transform on said indicator function to obtain preliminary Fourier coefficients;
    scaling said preliminary Fourier coefficients to obtain the Fourier coefficients for the Fourier representation of said mask transmission function;
    using said Fourier coefficients to obtain a print simulation of the lithography mask; and
    using said print simulation for the manufacture of at least one of integrated circuit and lithography mask,
    wherein at least one of the steps is carried out using a computer device,
    wherein said mask pattern comprises at least one tile, which in turn comprises said at least one polygon such that said at least one polygon is fully contained therein,
    wherein pixel size of said number of pixels is defined in at least one dimension,
    wherein said pixel size in said at least one dimension is obtained as i) a greatest common divider of tile size of said at least one tile in said at least one dimension and ii) coordinates of vertices of said at least one polygon in said at least one dimension.

12. The Method according to claim 11, wherein said Fourier Transform is a Fast Fourier Transform.

13. The Method according to claim 11, wherein the sampling step utilizes the minimum number of pixels.

* * * * *